(12) United States Patent
Arenberg

(10) Patent No.: US 7,075,713 B2
(45) Date of Patent: Jul. 11, 2006

(54) HIGH EFFICIENCY COLLECTOR FOR LASER PLASMA EUV SOURCE

(75) Inventor: Jonathan W. Arenberg, Santa Monica, CA (US)

(73) Assignee: University of Central Florida Research Foundation, Orlando, FL (US)

( * ) Notice: Subject to any disclaimer, the term of this patent is extended or adjusted under 35 U.S.C. 154(b) by 484 days.

(21) Appl. No.: 10/429,413

(22) Filed: May 5, 2003

(65) Prior Publication Data

US 2004/0223531 A1  Nov. 11, 2004

(51) Int. Cl.
*G02B 5/08* (2006.01)

(52) U.S. Cl. .................... 359/359; 359/366
(58) Field of Classification Search ............ 359/351, 359/360; 362/298, 303; 250/504 R, 365; 378/119, 34; 313/114
See application file for complete search history.

(56) References Cited

U.S. PATENT DOCUMENTS

| | | | | |
|---|---|---|---|---|
| 2,198,014 A | * | 4/1940 | Ott ............................ | 362/303 |
| 3,078,760 A | * | 2/1963 | Browuscombe ............ | 362/261 |
| 4,048,490 A | * | 9/1977 | Troue ......................... | 362/263 |
| 6,351,058 B1 | * | 2/2002 | Roberts ...................... | 313/113 |
| 6,586,757 B1 | * | 7/2003 | Melnychuk et al. ..... | 250/504 R |
| 6,590,959 B1 | * | 7/2003 | Kandaka et al. ............ | 378/119 |

FOREIGN PATENT DOCUMENTS

| EP | 0 343 729 A1 | 11/1989 |
|---|---|---|
| EP | 1 255 163 A2 | 11/2002 |

* cited by examiner

*Primary Examiner*—Drew A. Dunn
*Assistant Examiner*—Scott H. Stephens
(74) *Attorney, Agent, or Firm*—John A. Miller; Warn, Hoffmann, Miller & LaLone, P.C.

(57) ABSTRACT

Collector optics (70) for an EUV radiation source (10) for collecting EUV radiation (78). The collector optics (70) includes an elliptical dish reflector (72) where light generated at a focal point (76) of the reflector (72) is collected by the reflector (72) and is directed to a collection location (82). A frustal annular reflector (90) is positioned around an outer edge (84) of the dish reflector (72) to collect more of the EUV radiation (78) that may otherwise be lost. The radiation (78) reflected by the annular reflector (90) is directed to a center axicon reflector (94) positioned between the focal point (76) of the dish reflector (72) and the collection location (82) to redirect the radiation (78) reflected by the annular reflector (90) to be within a predetermined collection angle.

18 Claims, 2 Drawing Sheets

HIGH EFFICIENCY COLLECTOR FOR LASER PLASMA EUV SOURCE

BACKGROUND OF THE INVENTION

1. Field of the Invention

This invention relates generally to collector optics for a light source and, more particularly, to high efficiency collector optics for a laser plasma extreme ultraviolet (EUV) radiation source that collects a high percentage of the generated EUV radiation.

2. Discussion of the Related Art

Microelectronic integrated circuits are typically patterned on a substrate by a photolithography process, well known to those skilled in the art, where the circuit elements are defined by a light beam propagating through a mask. As the state of the art of the photolithography process and integrated circuit architecture becomes more developed, the circuit elements become smaller and more closely spaced together. As the circuit elements become smaller, it is necessary to employ photolithography light sources that generate light beams having shorter wavelengths and higher frequencies. In other words, the resolution of the photolithography process increases as the wavelength of the light source decreases to allow smaller integrated circuit elements to be defined. The current trend for photolithography light sources is to develop a system that generates light in the extreme ultraviolet (EUV) or soft X-ray wavelengths.

Various devices are the known in the art to generate EUV radiation. One of the most popular EUV radiation sources is a laser-plasma, gas condensation source that uses a gas, typically Xenon, as a laser plasma target material. Other gases, such as Argon and Krypton, and combinations of gases, are also known for the laser target material. In the known EUV radiation sources based on laser produced plasmas (LPP), the gas is typically cryogenically cooled in a nozzle to a liquid state, and then forced through an orifice or other nozzle opening into a vacuum process chamber as a continuous liquid stream or filament. The liquid target material rapidly freezes in the vacuum environment to become a frozen target stream. Cryogenically cooled target materials, which are gases at room temperature, are required because they do not condense on the source optics, and because they produce minimal by-products that have to be evacuated by the process chamber. In some designs, the nozzle is agitated so that the target material is emitted from the nozzle as a stream of liquid droplets having a certain diameter (30–100 µm) and a predetermined droplet spacing.

The target stream is radiated by high-power laser beam pulses, typically from an Nd:YAG laser, that heat the target material to produce a high temperature plasma which emits the EUV radiation. The frequency of the laser beam pulses is application specific and depends on a variety of factors. The laser beam pulses must have a certain intensity at the target area in order to provide enough heat to generate the plasma. Typical pulse durations are 5–30 ns, and a typical pulse intensity is in the range of $5 \times 10^{10} - 5 \times 10^{12}$ W/cm$^2$.

FIG. 1 is a plan view of an EUV radiation source 10 of the type discussed above including a nozzle 12 having a target material storage chamber 14 that stores a suitable target material, such as Xenon, under pressure. A heat exchanger or condenser is provided in the chamber 14 that cryogenically cools the target material to a liquid state. The liquid target material is forced through a narrowed throat portion or capillary tube 16 of the nozzle 12 to be emitted under pressure as a filament or stream 18 into a vacuum process chamber 26 towards a target area 20. The liquid target material will quickly freeze in the vacuum environment to form a solid filament of the target material as it propagates towards the target area 20. The vacuum environment in combination with the vapor pressure of the target material will cause the frozen target material to eventually break up into frozen target fragments, depending on the distance that the stream 18 travels and other factors.

A laser beam 22 from a laser source 24 is directed towards the target area 20 in the process chamber 26 to vaporize the target material filament. The heat from the laser beam 22 causes the target material to generate a plasma 30 that radiates EUV radiation 32. The EUV radiation 32 is collected by collector optics 34 and is directed to the circuit (not shown) being patterned, or other system using the EUV radiation 32. The collector optics 34 can have any shape suitable for the purposes of collecting and directing the radiation 32, such as an elliptical shape. In this design, the laser beam 22 propagates through an opening 36 in the collector optics 34, as shown. Other designs can employ other configurations.

In an alternate design, the throat portion 16 can be vibrated by a suitable device, such as a piezoelectric vibrator, to cause the liquid target material being emitted therefrom to form a stream of droplets. The frequency of the agitation determines the size and spacing of the droplets. If the target stream 18 is a series of droplets, the laser beam 22 may be pulsed to impinge every droplet, or every certain number of droplets.

It is desirable that as much of the EUV radiation as possible be collected to improve source efficiency. For example, the higher the intensity of the EUV radiation for a particular photolithography process, the less time is necessary to properly expose the various photoresists and the like that are being patterned. By decreasing the exposure time, more circuits can be fabricated, thus increasing the throughput efficiency and decreasing the cost. Further, by providing more useable EUV radiation from the collector optics, the intensity of the laser beam can be lower, also conserving system resources.

Optimizing the reflectance of the reflective surface of the collector optics is one way in which the amount of the EUV radiation that is collected can be increased. Typically, the reflective surface of the collector optics is coated with a reflective coating to enhance its reflectance. However, it is also important that the coating material not contaminate source components in response to high energy ions generated by the plasma that may impinge the reflective surface and release coating material. One such coating that provides the desired characteristics is silicon/molybdenum (Si/Mo) multilayer. However, the best Si/Mo coating on the collector optics only reflects about 70% of the EUV radiation impinging thereon, even at its theoretical maximum performance.

FIG. 2 is a plan view of collector optics 40 including an elliptical reflector 42 that collects and focuses EUV radiation 44, and is the same type as the collector optics 34 in the source 10. The elliptical reflector 42 includes a center opening 46 through which the laser beam propagates to a target area 50 at a focal point of the reflector 42 to generate the EUV radiation 44 in the manner as discussed above. The reflector 42 has an elliptical shape in that if the lines representing the reflector 42 were continued they would form a figure of rotation with elliptical cross section. The complete reflector 42 extends into and out of the paper to form an ellipsoidal reflector dish, as is well understood in the art.

As discussed above, it is important to collect as much of the EUV radiation 44 as possible. In the design shown herein, the EUV radiation 44 is reflected off an inner surface 58 of the reflector 42 and is directed to the other focal point 52 of the ellipse. Outer rays 54 and 56 of the EUV radiation 44 represent the outer most location relative to an outer edge 62 of the reflector 42 that the EUV radiation 44 is able to be collected, and still be directed towards the focal point 52. The outer most rays 54 and 56 define an outer surface of a cone within which the EUV radiation 44 is usable. Any EUV radiation outside of the cone defined by the rays 54 and 56 will not be useable because it is outside of the allowed collection angle of the photolithography side of the system that may use the EUV radiation source. Therefore, the size of the reflector 42 is limited, as shown. However, some of the EUV radiation 44 emitted from the target area 50, represented here as rays 60, is not collected by the reflector 42, and is thus lost in the system as wasted EUV radiation. The reflector 42 cannot be made any larger to collect the rays 60, and still satisfy the angular collection requirement.

SUMMARY OF THE INVENTION

In accordance with the teachings of the present invention, collector optics are disclosed that provides an increase of the collection of light. In one embodiment, the collector optics is part of an EUV radiation source for collecting EUV radiation. The collector optics includes a reflector, such as an elliptical dish reflector. The light generated at a focal point of the reflector is reflected by the reflector and is directed to a collection location. An annular reflector is provided around an outer edge of the dish reflector to collect more of the light that may otherwise be lost. The light reflected by the annular reflector is directed to a center reflector positioned between the focal point of the dish reflector and the collection location to redirect the light reflected by the annular reflector to be within a predetermined collection zone and angle.

In one embodiment, the annular reflector has a linear shape and the center reflector (axicon) is a conical reflector with a small polynomial shape where the light is reflected off of an inside surface of the annular reflector and off of an outside surface of the center reflector. In an alternate embodiment, the annular reflector is a polynomial of revolution reflector and the center reflector is a linear cone reflector.

Additional advantages and features of the present invention will become apparent from the following description and appended claims, taken in conjunction with the accompanying drawings.

DETAILED DESCRIPTION OF THE EMBODIMENTS

The following discussion of the embodiments of the invention directed to collector optics for an EUV radiation source is merely exemplary in nature and is in no way intended to limit the invention or its application or uses. For example, the discussion below specifically talks about the collector optics being used in an EUV radiation source. However, as will be appreciated by those skilled in the art, the collector optics will have application for other systems for collecting other wavelengths of light.

Figure 1:
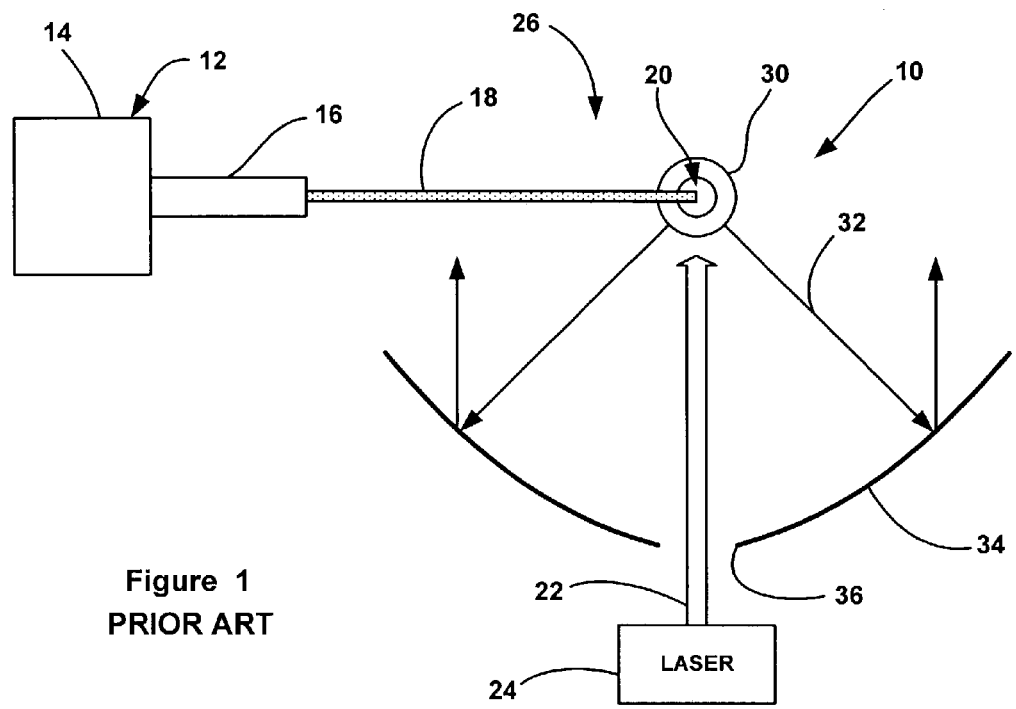
FIG. 1 is a plan view of a known EUV radiation source.
Figure 2:
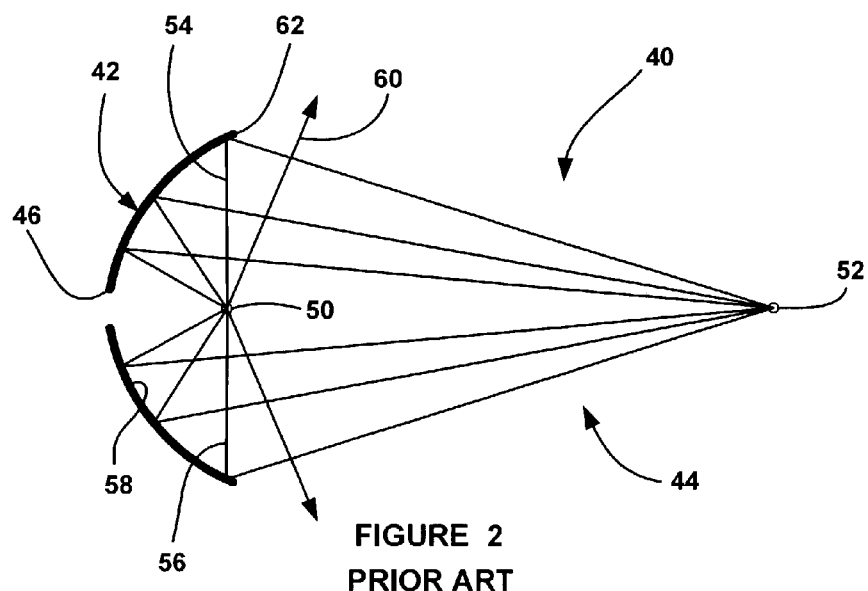
FIG. 2 is a cross-sectional plan view of known collector optics for the EUV radiation source shown in FIG. 1.
Figure 3:
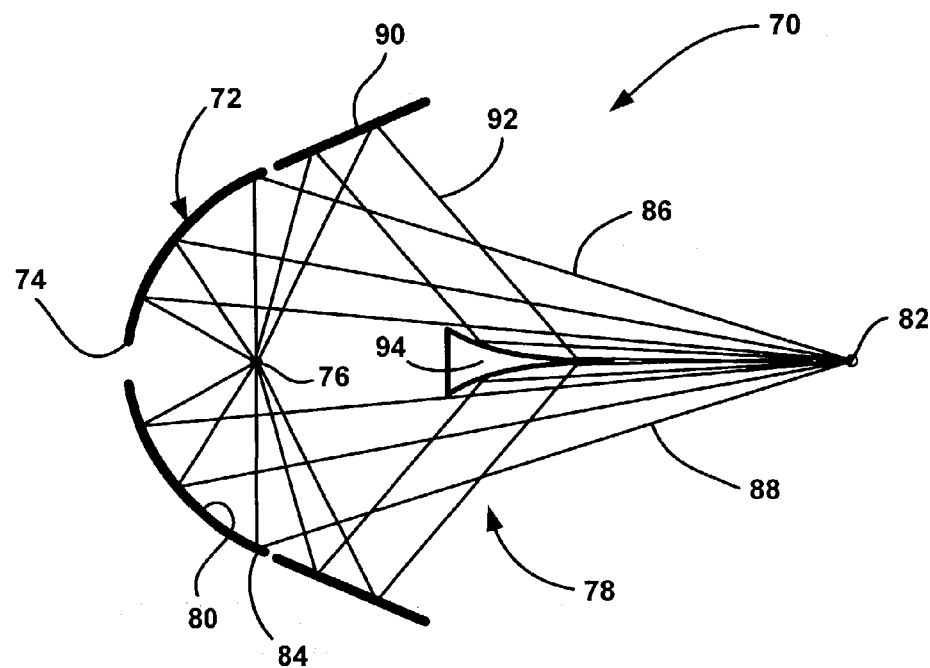
FIG. 3 is a cross-sectional plan view of collector optics for collecting light, such as EUV radiation, according to an embodiment of the present invention.

FIG. 3 is a cross-sectional plan view of collector optics 70 that is useable in the EUV radiation source 10, discussed above, according to an embodiment of the present invention. The collector optics 70 includes an elliptical dish reflector 72 including a center opening 74 through which a laser beam propagates to a target area 76, as discussed above. EUV radiation 78 is generated at the target area 76, reflected off of an inner surface 80 of the dish reflector 72 and is directed to a collection location 82, as discussed above. In this embodiment, the target area 76 is at one focal point of the elliptical reflector 72 and the collection location 82 is at the other focal point of the elliptical reflector 72. It is noted, however, that in other embodiments within the scope of the present invention, the elliptical reflector 72 can have other optical shapes suitable for a particular application, where the target area 76 and the collection location 82 may not be focal points of the reflector 72.

As discussed above, outer rays 86 and 88 of the radiation 78 reflected from an outer edge 84 of the reflector 72 define an outer cone surface, where light outside of the cone is unuseable. If the dish reflector 72 were to be made larger, then the cone defined by the rays 86 and 88 would define a larger cone where part of the radiation 78 would be outside the angular acceptance of the system using the EUV radiation 78. According to the invention, an annular reflector 90, such as an annular linear frustum reflector, is provided adjacent to the outer edge 84 of the reflector 72 to collect and reflect the EUV radiation 78 that may otherwise be lost. Therefore, optical rays 92 of the radiation 78 that would not be reflected by the reflector 72 are reflected by the annular reflector 90.

Normally, the optical rays 92 reflected by the reflector 90 would be outside the cone defined by the rays 86 and 88. However, according to the invention, a center reflector 94, for example, a powered axicon reflector, is provided between the target area 76 and the collection location 82 to redirect the light rays 92 reflected by the reflector 90. As is apparent, the light rays 92 reflected from the annular reflector 90 are redirected by the reflector 94 to be within the cone define by the rays 86 and 88. In this embodiment, the reflectors 90 and 94 are both surfaces of rotation where the light rays 92 are reflected off of an inner surface of the reflector 90 and are reflected off an outer surface of the reflector 94.

The inner surface of the reflector 90 and the outer surface of the reflector 94 are coated with a suitable coating for EUV radiation sources. In one embodiment, the coating on the reflectors 90 and 94 is the same as the coating on the inner surface 80 of the reflector 72, which will generally be a Si/Mo multilayer.

Figure 4:
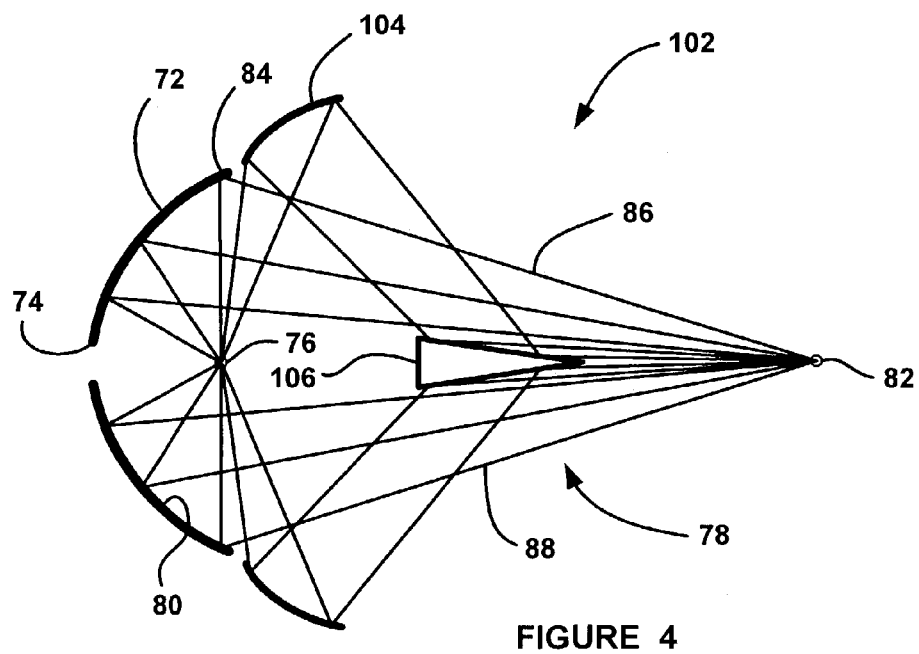
FIG. 4 is a cross-sectional plan view of collector optics for collecting light, such as EUV radiation, according to another embodiment of the present invention.

FIG. 4 is a cross-sectional plan view of collector optics 102, similar to the collector optics 70, that can also be used in the radiation source 10, according to another embodiment of the present invention, where like elements are represented by the same reference numeral. In this embodiment, the annular reflector 90 is replaced with an annular reflector 104 that has a curved configuration, as shown. Also, the center reflector 94 is replaced with a linear axicon reflector 10 or a frustum reflector with power. In this embodiment, the light rays that would normally be lost, are collected and redirected by the reflectors 104 and 106.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. Collector optics for a light source, said optics comprising:
   a main reflector having a focal point, where light generated at the focal point of the main reflector is directed to a light collection location;
   a single annular reflector completely extending around an outer edge of the main reflector, said annular reflector reflecting light from the focal point not reflected by the main reflector; and
   a center reflector positioned between the focal point and the collection location, wherein the light reflected from the annular reflector is reflected off of the center reflector and directed towards the collection location, and wherein the annular reflector is linear and the center reflector is a powered axicon reflector, where the light is reflected off of an inside surface of the annular reflector and is reflected off of an outside surface of the center reflector.

2. The collector optics according to claim 1 wherein the main reflector is a dish reflector having a predetermined size so that light reflected from the main reflector is confined to be within a predetermined cone of reflection, and wherein the light reflected from the center reflector is within the cone of reflection.

3. The collector optics according to claim 1 wherein the main reflector is an elliptical reflector and the collection location is a focal point of the elliptical reflector.

4. The collector optics according to claim 1 wherein the main reflector includes a center opening through which a laser beam propagates to generate the light at the focal point.

5. The collector optics according to claim 1 wherein the reflecting surface of the main reflector, the annular reflector and the center reflector have a reflective coating including an Si/Mo multilayer.

6. The collector optics according to claim 1 wherein the collector optics is part of an EUV radiation source and wherein the light is EUV radiation.

7. The collector optics according to claim 6 wherein the focal point is a target location where a laser beam vaporizes a target material to generate the EUV radiation.

8. An extreme ultraviolet (EUV) radiation source for generating EUV radiation, said source comprising:
   a device for generating a stream of a target material, said target material stream being directed towards a target area;
   a laser source generating a laser beam directed towards the target area, said laser beam interacting with the target material to generate the EUV radiation; and
   collector optics collecting the EUV radiation and directing the EUV radiation to a collection location, said collector optics including a main reflector where the target area is at a focal point of the main reflector, a single annular reflector completely extending around an outer edge of the main reflector and a center reflector positioned between the focal point and the collection location, wherein the EUV radiation generated at the target area is reflected by the main reflector and directed to the collection location, and wherein the annular reflector reflects light from the target area not reflected by the main reflector, where the light reflected by the annular reflector is reflected off of the center reflector and directed towards the collection location, and wherein the annular reflector is a linear frustum and the center reflector is a powered axicon reflector, where the radiation is reflected off of an inside surface of the annular reflector and is reflected off of an outside surface of the center reflector.

9. The source according to claim 8 wherein the main reflector is a dish reflector having a predetermined size so that radiation reflected from the main reflector is confined to be within a predetermined angle of reflection, and wherein the radiation reflected from the center reflector is within the angle of reflection.

10. The source according to claim 8 wherein the main reflector is an elliptical reflector and the collection location is a focal point of the elliptical reflector.

11. The source according to claim 8 wherein the main reflector includes a center opening through which the laser beam propagates to generate the EUV radiation.

12. The source according to claim 8 wherein the reflecting surface of the main reflector, the annular reflector and the center reflector includes an Si/Mo multilayer.

13. A method for collecting light, comprising:
   reflecting the light from a main reflector;
   reflecting light from a single annular reflector completely extending around an outer edge of the main reflector that is not reflected by the main reflector;
   reflecting light from a center reflector that is reflected by the annular reflector; and
   directing the light reflected from the center reflector to the collection location, wherein reflecting light from an annular reflector and a center reflector includes reflecting light from a linear annular reflector and a conical center reflector, where the light is reflected off an inside surface of the annular reflector and is reflected off of an outside surface of the center reflector.

14. The method according to claim 13 wherein reflecting the light from a main reflector includes reflecting light to be within a predetermined angle, and wherein the light reflected from the center reflector is within the angle.

15. The method according to claim 13 wherein reflecting light from a main reflector includes reflecting light from an elliptical dish reflector.

16. Collector optics for a light source, said optics comprising:
   a main reflector having a focal point, where light generated at the focal point of the main reflector is directed to a light collection location;
   a single annular reflector completely extending around an outer edge of the main reflector, said annular reflector reflecting light from the focal point not reflected by the main reflector; and
   a center reflector positioned between the focal point and the collection location, wherein the light reflected from the annular reflector is reflected off of the center reflector and directed towards the collection location, and wherein the annular reflector is a curved reflector and the center reflector is a linear axicon reflector.

17. An extreme ultraviolet (EUV) radiation source for generating EUV radiation, said source comprising:
   a device for generating a stream of a target material, said target material stream being directed towards a target area;
   a laser source generating a laser beam directed towards the target area, said laser beam interacting with the target material to generate the EUV radiation; and collector optics collecting the EUV radiation and directing the EUV radiation to a collection location, said collector optics including a main reflector where the target area is at a focal point of the main reflector, a single annular reflector completely extending around an outer edge of the main reflector and a center reflector positioned between the focal point and the collection location, wherein the EUV radiation generated at the target area is reflected by the main reflector and directed to the collection location, and wherein the annular reflector reflects light from the target area not reflected by the main reflector, where the light reflected by the annular reflector is reflected off of the center reflector and directed towards the collection location, and wherein the annular reflector is a frustum with power reflector and the center reflector is a linear axicon reflector.

18. A method for collecting light, comprising:

reflecting the light from a main reflector to a light collection location;

reflecting light from a single annular reflector completely extending around an outer edge of the main reflector that is not reflected by the main reflector;

reflecting light from a center reflector that is reflected by the annular reflector; and directing the light reflected from the center reflector to the collection location, wherein reflecting light from an annular reflector and a center reflector includes reflecting light from a curved annular reflector and a linear axicon reflector.

* * * * *